(12) United States Patent
Horiuchi et al.

(10) Patent No.: US 11,448,702 B2
(45) Date of Patent: Sep. 20, 2022

(54) CHARGING METHOD FOR NONAQUEOUS ELECTROLYTE SECONDARY CELL AND CHARGING SYSTEM FOR NONAQUEOUS ELECTROLYTE SECONDARY CELL

(71) Applicant: Panasonic Intellectual Property Management Co., Ltd., Osaka (JP)

(72) Inventors: Yuto Horiuchi, Osaka (JP); Taisuke Yamamoto, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 120 days.

(21) Appl. No.: 17/056,206

(22) PCT Filed: May 20, 2019

(86) PCT No.: PCT/JP2019/019820
§ 371 (c)(1),
(2) Date: Nov. 17, 2020

(87) PCT Pub. No.: WO2019/230464
PCT Pub. Date: Dec. 5, 2019

(65) Prior Publication Data
US 2021/0364575 A1    Nov. 25, 2021

(30) Foreign Application Priority Data
May 29, 2018    (JP) ............... JP2018-102450

(51) Int. Cl.
*H02J 7/04*    (2006.01)
*G01R 31/378*  (2019.01)
(Continued)

(52) U.S. Cl.
CPC ......... *G01R 31/378* (2019.01); *G01R 31/382* (2019.01); *H01M 10/44* (2013.01);
(Continued)

(58) Field of Classification Search
None
See application file for complete search history.

(56) References Cited

U.S. PATENT DOCUMENTS

| 6,377,030 B1 | 4/2002 | Asao et al. |
| 10,181,740 B2 * | 1/2019 | Tanaka .................... B60L 15/20 |

(Continued)

FOREIGN PATENT DOCUMENTS

| JP | 2000-106219 A | 4/2000 |
| JP | 2010-212228 A | 9/2010 |

(Continued)

OTHER PUBLICATIONS

International Search Report dated Jul. 16, 2019, issued in counterpart International Application No. PCT/JP2019/019820 (2 pages).

*Primary Examiner* — Arun C Williams
(74) *Attorney, Agent, or Firm* — WHDA, LLP (57) ABSTRACT

A method for charging a nonaqueous electrolyte secondary battery includes a first charging step of charging a first capacity $Q_{1st}$ at a first constant current value $I_{1st}$, the first capacity $Q_{1st}$ including a capacity range in which $dQ_{Si}/dQ$ is more than or equal to a predetermined threshold value, a second charging step of charging a second capacity at a second constant current value more than the first constant current value, a detection step of acquiring at least one of $dV/dQ$ and $dQ_{Si}/dQ$, and a changing step of changing at least one of the timing of switching between the first charging step and the second charging step and the first constant current value $I_{1st}$ on the basis of a change in time of $dV/dQ$ or $dQ_{Si}/dQ$.

7 Claims, 6 Drawing Sheets

(51) Int. Cl.

| | | |
|---|---|---|
| *G01R 31/382* | (2019.01) | |
| *H02J 7/00* | (2006.01) | |
| *H01M 10/44* | (2006.01) | |
| *H01M 10/48* | (2006.01) | |
| H01M 4/134 | (2010.01) | |
| H01M 4/62 | (2006.01) | |
| H01M 4/02 | (2006.01) | |

(52) U.S. Cl.
CPC ........... *H01M 10/48* (2013.01); *H02J 7/0047* (2013.01); *H02J 7/007182* (2020.01); *H01M 4/134* (2013.01); *H01M 4/625* (2013.01); *H01M 2004/027* (2013.01)

(56) References Cited

U.S. PATENT DOCUMENTS

| | | | |
|---|---|---|---|
| 2011/0181249 A1 | 7/2011 | Deguchi et al. | |
| 2011/0267006 A1* | 11/2011 | Tanno | H01M 10/44 320/116 |
| 2016/0028254 A1* | 1/2016 | Honoki | H02J 7/00 320/162 |
| 2016/0336592 A1 | 11/2016 | Hirose et al. | |
| 2018/0233943 A1* | 8/2018 | Koizumi | H02J 7/1423 |

FOREIGN PATENT DOCUMENTS

| | | |
|---|---|---|
| JP | 2014-56683 A | 3/2014 |
| JP | 2015-165482 A | 9/2015 |
| WO | 2011/033700 A1 | 3/2011 |

* cited by examiner

CHARGING METHOD FOR NONAQUEOUS ELECTROLYTE SECONDARY CELL AND CHARGING SYSTEM FOR NONAQUEOUS ELECTROLYTE SECONDARY CELL

TECHNICAL FIELD

The present disclosure relates to a method for charging a nonaqueous electrolyte secondary battery and a charging system for the nonaqueous electrolyte secondary battery.

BACKGROUND ART

It is known that, compared with a carbon material such as graphite, a Si-containing compound can occlude a larger amount of lithium ions per unit volume. For example, PTL 1 discloses a nonaqueous electrolyte secondary battery in which graphite and a Si-containing compound are used as a negative electrode active material. Meanwhile, PTL 2 discloses a method for charging a nonaqueous electrolyte secondary battery for the purpose of reducing an initial irreversible capacity during a charge-discharge cycle.

CITATION LIST

Patent Literature

PTL 1: Japanese Published Unexamined Patent Application No. 2010-212228

PTL 2 Japanese Published Unexamined Patent Application No. 2000-106219

SUMMARY OF INVENTION

Incidentally, regarding a nonaqueous electrolyte secondary battery including a negative electrode that contains a Si-containing compound, if a charging current is increased, for example, cracking of the Si-containing compound occurs, deterioration proceeds, and it becomes difficult to ensure favorable cycle characteristics. On the other hand, if the charging current is reduced to a low level, a long charging time is required. It is an object of the present disclosure to provide a charging method that enables efficient charging to be performed while maintaining favorable cycle characteristics regarding a nonaqueous electrolyte secondary battery including a negative electrode that contains a carbon material and a Si-containing compound.

A method for charging a nonaqueous electrolyte secondary battery according to an aspect of the present disclosure is a method for charging a nonaqueous electrolyte secondary battery including a negative electrode that contains a carbon material and a Si-containing compound as a negative electrode active material and the method includes the steps of charging a first capacity $Q_{1st}$ at a first constant current value $I_{1st}$, the first capacity $Q_{1st}$ including a capacity range in which the ratio $dQ_{Si}/dQ$ of the amount of change in capacity $Q_{Si}$ of the Si-containing compound relative to the amount of change in battery capacity Q is more than or equal to a predetermined threshold value, as a first charging step, charging a second capacity at a second constant current value more than the first constant current value in a second charging step after the first charging step is complete, acquiring at least one of the ratio $dV/dQ$ of the amount of change in open-circuit voltage relative to the amount of change in battery capacity Q and $dQ_{Si}/dQ$, as a detection step, and changing at least one of the timing of switching between the first charging step and the second charging step and the first constant current value $I_{1st}$ on the basis of a change in time of $dV/dQ$ or $dQ_{Si}/dQ$, as a changing step.

A charging system for a nonaqueous electrolyte secondary battery according to an aspect of the present disclosure is a charging system for charging a nonaqueous electrolyte secondary battery including a negative electrode that contains a carbon material and a Si-containing compound as a negative electrode active material and includes a charging control apparatus that performs the above-described method for charging.

According to an aspect of the present disclosure, a charging method that enables efficient charging to be performed while maintaining favorable cycle characteristics can be provided regarding a nonaqueous electrolyte secondary battery including a negative electrode that contains a carbon material and a Si-containing compound. That is, the charging method according to the present disclosure enables the cycle characteristics to be suppressed from deteriorating while charging can be performed in a short time.

DESCRIPTION OF EMBODIMENTS

Regarding a nonaqueous electrolyte secondary battery including a negative electrode that contains a carbon material and a Si-containing compound, it is a very important issue to provide a charging method that enables charging to be sufficiently performed in a short time and that enables the cycle characteristics to be suppressed from deteriorating. The present inventors succeeded in efficiently suppressing cycle characteristics from deteriorating during charging of a battery by clarifying a region in which a large capacity change is caused due to a Si-containing compound, that is, a region in which lithium ions are readily occluded by the Si-containing compound, and by applying a relaxed charging condition to this region only.

Meanwhile, the rate of deterioration in accordance with a charge-discharge cycle of the carbon material is different from that of the Si-containing compound. The charging method according to the present disclosure enables the cycle characteristics to be further suppressed from deteriorating by changing at least one of the timing of switching between the first charging step and the second charging step and the first constant current value list on the basis of a change in time of dV/dQ or $dQ_{Si}/dQ$ described above.

Figure 2:
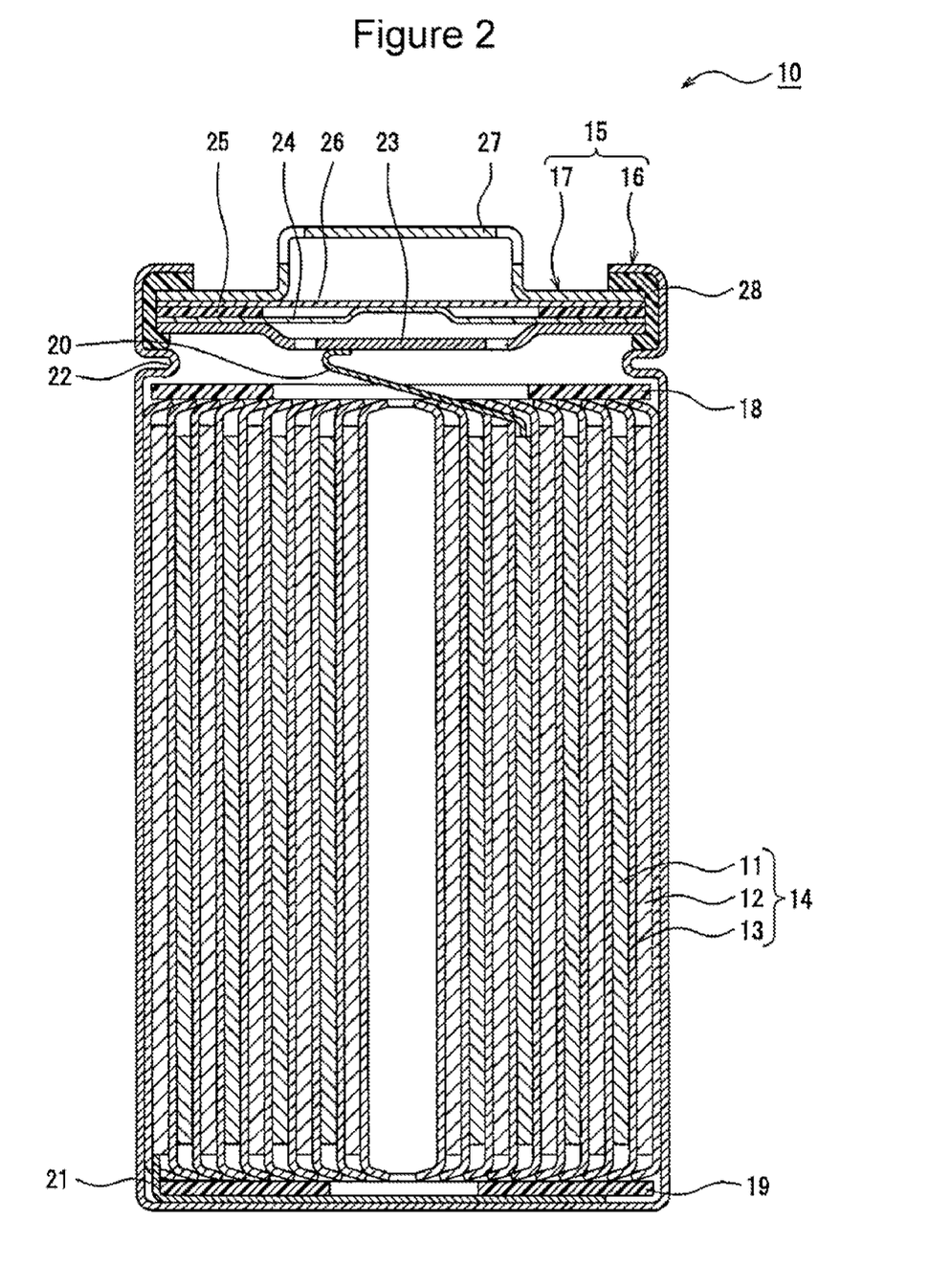
FIG. 2 is a sectional view of a nonaqueous electrolyte secondary battery that is an example of an embodiment.

An example of the embodiment according to the present disclosure will be described below in detail. In the following example, a cylindrical battery in which a roll-type electrode body 14 is housed in a cylindrical battery case 15 will be described. However, the battery case is not limited to being cylindrical and may be, for example, rectangular. The battery case may be formed from a laminate sheet including a metal layer and a resin layer. Meanwhile, the electrode body may be of a multilayer type in which a plurality of positive electrodes and a plurality of negative electrodes are alternately stacked with respective separators interposed therebetween. The charging method according to the present disclosure can be applied to nonaqueous electrolyte secondary batteries provided that the battery includes a negative electrode that contains a carbon material and a Si-containing compound as a negative electrode active material.

Figure 1:
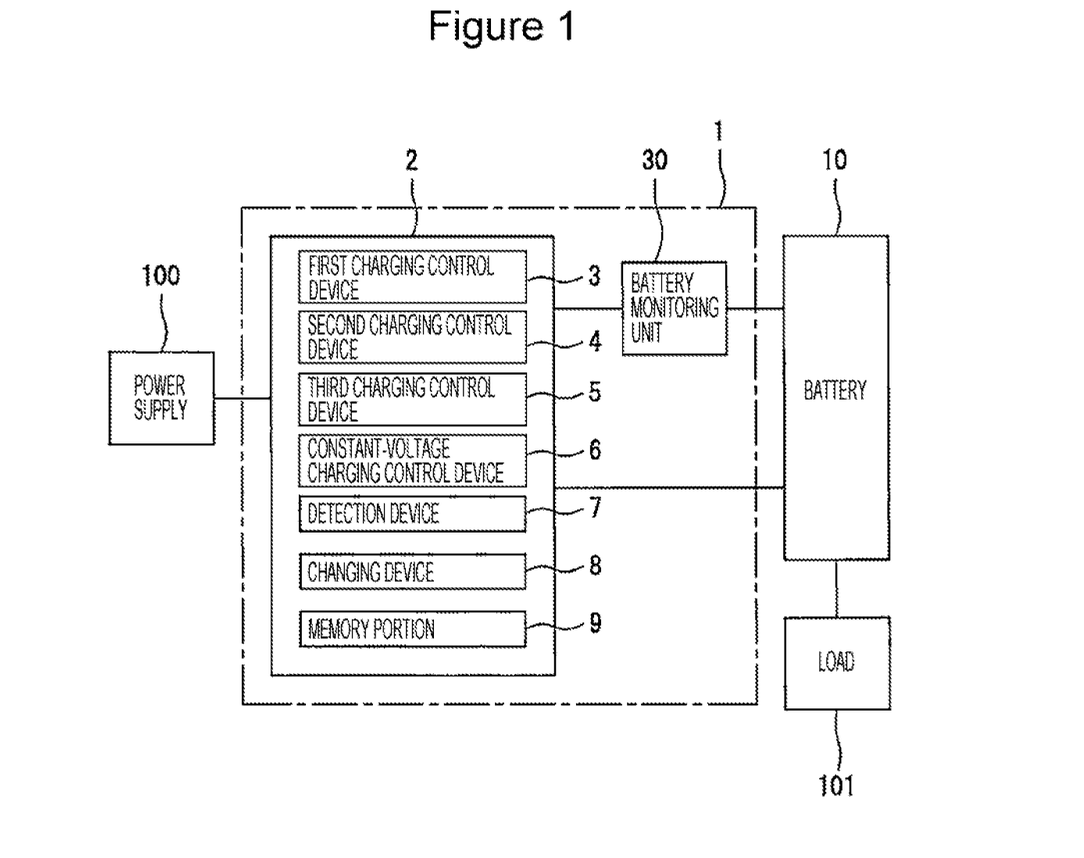
FIG. 1 is a block diagram illustrating the configuration of a charging system for a nonaqueous electrolyte secondary battery that is an example of an embodiment.

FIG. 1 is a block diagram illustrating the configuration of a charging system 1 for a nonaqueous electrolyte secondary battery that is an example of the embodiment. As illustrated in FIG. 1, the charging system 1 includes a charging control apparatus 2 for controlling charging of a nonaqueous electrolyte secondary battery 10 and a battery monitoring unit 30 for monitoring the charging state of the battery. The nonaqueous electrolyte secondary battery 10 is connected to a load 101 so as to feed electric power stored therein to the load 101. The charging system 1 may include an assembled battery (also referred to as a battery pack or a battery module) in which a plurality of nonaqueous electrolyte secondary batteries 10 are connected to each other in series, in parallel, or in a series-parallel combination.

The charging system 1 can be widely applied to charging apparatuses and charging equipment for nonaqueous electrolyte secondary batteries containing a carbon material and a Si-containing compound as a negative electrode active material and can be applied to various apparatuses and equipment, for example, vehicles such as electric cars and hybrid cars, charging equipment for vehicles, power storage devices, and battery chargers for electric tools. The charging control apparatus 2 may be incorporated in the battery module or may be configured to serve as part of a control apparatus of an apparatus or equipment of a vehicle or the like on which the charging system 1 is mounted.

The charging control apparatus 2 is an apparatus for realizing the charging method described later. When the battery is charged, the charging control apparatus 2 determines the battery charging condition in accordance with the charging state of the battery acquired from the battery monitoring unit 30. The charging control apparatus 2 includes a first charging control device 3 for performing a first charging step, a second charging control device 4 for performing a second charging step, a third charging control device 5 for performing a third charging step, and a constant-voltage charging control device 6 for performing a constant-voltage charging step, as described later in detail. In addition, the charging control apparatus 2 includes a detection device 7 for performing a detection step and a changing device 8 for performing a changing step. The charging control apparatus 2 has, for example, a rectifier circuit and converts alternating current power of a power supply 100 to predetermined direct current power so as to feed the nonaqueous electrolyte secondary battery 10.

The charging control apparatus 2 is composed of an integrated circuit, for example, an IC chip or an LSI chip, and has a CPU serving as an arithmetic processing portion and a memory portion 9. The CPU has a function of reading and executing programs and the like stored in the memory portion 9 in advance. The memory portion 9 has a function of temporarily storing read programs, processed data, and the like and a function of storing control programs, threshold values, and the like. The functions of each of the above-described charging control devices is realized by, for example, executing the program stored in the memory portion 9.

In addition, the charging control apparatus 2 has a constant-current circuit for controlling the charging current so that direct current power with a predetermined current value is fed to the battery, a constant-voltage circuit for controlling the charging voltage so that direct current power with a predetermined voltage value is fed to the battery, and the like. In this regard, the charging circuits such as the rectifier circuit, the constant-current circuit, and the constant-voltage circuit may be formed as apparatuses other than the charging control apparatus 2. The charging control apparatus 2 controls the charging circuits in accordance with the charging state of the battery acquired from the battery monitoring unit 30 so as to perform charging of the nonaqueous electrolyte secondary battery 10.

The battery monitoring unit 30 detects, for example, the charging current fed to the nonaqueous electrolyte secondary battery 10 and the battery voltage. The charging control apparatus 2 estimates the state of charge (SOC) from the battery voltage acquired by the battery monitoring unit 30 and performs charging control on the basis of the SOC. In this regard, the SOC may also be estimated from the charge-discharge current and the charge-discharge time. A known technique in the related art may be applied to the method for estimating the SOC. For example, the charging control apparatus 2 performs constant-current charging (CC charging) including a plurality of steps until the battery voltage reaches a predetermined voltage and, thereafter, performs constant-voltage charging (CV charging).

[Nonaqueous Electrolyte Secondary Battery]

FIG. 2 is a sectional view of a nonaqueous electrolyte secondary battery 10 that is an example of the embodiment. As illustrated in FIG. 2, the nonaqueous electrolyte secondary battery 10 includes the electrode body 14, a nonaqueous electrolyte (not illustrated in the drawing), and the battery case 15 for housing the electrode body 14 and the nonaqueous electrolyte. The electrode body 14 has a rolled structure in which the positive electrode plate 11 and the negative electrode plate 12 are rolled with a separator 13 interposed therebetween. The battery case 15 is composed of a tubular outer jacket can 16 with a bottom and a sealing body 17 that blocks the opening portion of the outer jacket can 16. In addition, the nonaqueous electrolyte secondary battery 10 includes a resin gasket 28 arranged between the outer jacket can 16 and the sealing body 17.

The nonaqueous electrolyte contains a nonaqueous solvent and an electrolyte salt dissolved in the nonaqueous solvent. Regarding the nonaqueous solvent, for example, esters, ethers, nitriles, and amides and mixed solvents of at least two of these may be used. The nonaqueous solvent may contain halogen-substituted products in which at least some hydrogen atoms of these solvents are substituted with halogen atoms such as fluorine atoms. In this regard, the nonaqueous electrolyte is not limited to being a liquid electrolyte and may be a solid electrolyte using a gel polymer or the like. Regarding the electrolyte salt, for example, a lithium salt such as $LiPF_6$ is used.

The electrode body 14 is composed of an elongated positive electrode plate 11, an elongated negative electrode plate 12, two elongated separators 13, a positive electrode tab 20 connected to the positive electrode plate 11, and a negative electrode tab 21 connected to the negative electrode plate 12. The negative electrode plate 12 is formed one size larger than the positive electrode plate 11 to suppress lithium from precipitating. That is, the negative electrode plate 12 is formed so as to be longer than the positive electrode plate 11 in the longitudinal direction and the width direction (transverse direction). The two separators 13 are formed one size larger than at least the positive electrode plate 11 and are arranged so as to interpose the positive electrode plate 11 therebetween.

Insulating plates 18 and 19 are arranged on and under the electrode body 14, respectively. In the example illustrated in FIG. 2, the positive electrode tab 20 attached to the positive electrode plate 11 extends toward the sealing body 17 while passing through a through hole of the insulating plate 18, and the negative electrode tab 21 attached to the negative electrode plate 12 extends toward the bottom portion of the outer jacket can 16 while passing outside the insulating plate 19. The positive electrode tab 20 is connected, by welding or the like, to the lower surface of the filter 23 serving as the bottom plate of the sealing body 17, and the cap 27 that is electrically connected to the filter 23 and that is on the top plate of the sealing body 17 serves as a positive electrode terminal. The negative electrode tab 21 is connected, by welding or the like, to the inner surface of the bottom portion of the outer jacket can 16, and the outer jacket can 16 serves as a negative electrode terminal.

The outer jacket can 16 is, for example, a cylindrical metal container with a bottom. As described above, the gasket 28 is disposed between the outer jacket can 16 and the sealing body 17 so as to hermetically seal the internal space of the battery case 15. The outer jacket can 16 has a grooved portion 22 that is formed by, for example, pressing the side surface portion from the outside and that supports the sealing body 17. Preferably, the grooved portion 22 is formed into an annular shape in the circumferential direction of the outer jacket can 16, and the upper surface of the grooved portion 22 supports the sealing body 17. Meanwhile, the upper end portion of the outer jacket can 16 is folded inward and swaged with the peripheral edge portion of the sealing body 17.

The sealing body 17 has a structure in which the filter 23, a lower valve body 24, an insulating member 25, an upper valve body 26, and the cap 27 are stacked successively from the electrode group 14. Each member constituting the sealing body 17 has, for example, a disc shape or a ring shape, and the members other than the insulating member 25 are electrically connected to each other. The center portion of the lower valve body 24 and the center portion of the upper valve body 26 are connected to each other, and the insulating member 25 is interposed between the peripheral edge portions of the lower valve body 24 and the upper valve body 26. When the internal pressure of the battery is increased due to abnormal heat generation, the lower valve body 24 deforms so as to push up the upper valve body 26 toward the cap 27 and ruptures. As a result, a current path between the lower valve body 24 and the upper valve body 26 is broken. When the internal pressure is further increased, the upper valve body 26 ruptures, and gas is discharged through an opening portion of the cap 27.

[Positive Electrode]

The positive electrode 11 has a positive electrode collector and positive electrode mix layers disposed on the respective surfaces of the positive electrode collector. Foil of a metal that is stable in the potential range of the positive electrode 11, for example, aluminum, a film provided with the metal on the surface layer, or the like, may be used for the positive electrode collector. The positive electrode mix layer contains a positive electrode active material, a conductive material, and a binder. The positive electrode 11 may be produced by, for example, coating the positive electrode collector with a positive electrode mix slurry containing the positive electrode active material, the conductive material, the binder, and the like, drying the coating film, and performing compression so as to form positive electrode mix layers on the respective surfaces of the positive electrode collector.

The positive electrode active material is configured to contain a lithium metal complex oxide as a primary component. Examples of the metal element contained in the lithium metal complex oxide include Ni, Co, Mn, Al, B, Mg, Ti, V, Cr, Fe, Cu, Zn, Ga, Sr, Zr, Nb, In, Sn, Ta, and W. An example of the preferable lithium metal complex oxide is a complex oxide containing at least one of Ni, Co, Mn, and Al. In this regard, for example, inorganic compound particles such as aluminum oxide or a lanthanoid-containing compound may be fixed to the particle surfaces of the lithium metal complex oxide.

Examples of the conductive material contained in the positive electrode mix layer include carbon materials such as carbon black, acetylene black, Ketjenblack, and graphite. Examples of the binder contained in the positive electrode mix layer include fluororesins such as polytetrafluoroethylenes (PTFE) and polyvinylidene fluorides (PVdF), polyacrylonitriles (PAN), polyimide resins, acrylic resins, and polyolefin resins. These resins may be used in combination with cellulose derivatives such as carboxymethyl cellulose (CMC) or salts thereof, polyethylene oxides (PEO), or the like.

[Negative Electrode]

The negative electrode 12 has a negative electrode collector and negative electrode mix layers disposed on the respective surfaces of the negative electrode collector. Foil of a metal that is stable in the potential range of the negative electrode 12, for example, copper, a film provided with the metal on the surface layer, or the like may be used for the negative electrode collector. The negative electrode mix layer contains a negative electrode active material and a binder. The negative electrode 12 may be produced by, for example, coating the negative electrode collector with a negative electrode mix slurry containing the negative electrode active material, the binder, and the like, drying the coating film, and performing compression so as to form negative electrode mix layers on the respective surfaces of the negative electrode collector.

In the negative electrode mix layer, a carbon material that can reversibly occlude and release lithium ions and a Si-containing compound are contained as a negative electrode active material. A preferable carbon material is graphite, for example, natural graphite such as natural flake graphite, vein graphite, or amorphous graphite or artificial graphite such as massive artificial graphite (MAC) or graphitized mesophase carbon microbeads (MCMB). The content of the Si-containing compound in the negative electrode mix layer is, for example, 1% by mass to 15% by mass and preferably 5% by mass to 10% by mass relative to the total mass of the negative electrode active material. The mixing ratio of the Si-containing compound to the graphite is, for example, 1:99 to 15:85 and preferably 5:95 to 10:90 on a mass ratio basis.

Regarding the negative electrode active material, metals excluding Si that are alloyed with lithium, alloys containing such metals, and compounds containing such metals may be used. In the case in which a material having low conductivity, for example, lithium titanate, is used as the negative electrode active material, a conductive material, for example, carbon black, may be added to the negative electrode mix layer.

Examples of the Si-containing compound include compounds represented by $SiO_x$. The Si-containing compound is, for example, $SiO_x$ ($0.5 \leq x \leq 1.6$) and has a structure in which Si fine particles are dispersed in an amorphous $SiO_2$ matrix. The Si-containing compound may be a compound (LSi) in which Si fine particles are dispersed in a lithium silicate ($Li_{2y}SiO_{(2+y)}$ ($0<y<2$)) phase. The negative electrode mix layer may contain $SiO_x$ and LSi.

It is preferable that a conductive coating film composed of a material having higher conductivity than the Si-containing compound be disposed on the particle surfaces of the Si-containing compound. Examples of the constituent material of the conductive coating film include at least one selected from carbon materials, metals, and metal compounds. Of these, carbon materials such as amorphous carbon are preferable. The carbon coating film may be formed by, for example, a CVD method in which acetylene, methane, or the like is used or a method in which coal pitch, petroleum pitch, a phenol resin, or the like is mixed with Si-containing compound particles and heat treatment is performed. Alternatively, the conductive coating film may be formed by fixing a conductive filler such as carbon black to particle surfaces of the Si-containing compound by using a binder. The amount of the conductive coating film formed is, for example, 0.5% by mass to 10% by mass relative to the mass of the Si-containing compound particles.

Regarding the binder contained in the negative electrode mix layer, fluororesins, PAN, polyimide resins, acrylic resins, polyolefin resins, and the like may be used as in the positive electrode 11. However, preferably, styrene-butadiene rubber (SBR) or a modified product thereof is used. Regarding the negative electrode mix layer, in addition to SBR or the like, CMC or salts thereof, polyacrylic acids (PAA) or salts thereof, polyvinyl alcohols, and the like may be contained.

[Separator]

Regarding the separator 13, a porous sheet having ion permeability and insulation performance is used. Specific examples of the porous sheet include microporous thin films, woven fabrics, and nonwoven fabrics. Olefin resins such as polyethylenes and polypropylenes, celluloses, and the like are suitable for the material for forming the separator 13. The separator 13 may have either a single-layer structure or a multilayer structure. A heat-resistant layer or the like may be disposed on the surface of the separator 13.

The method for charging the nonaqueous electrolyte secondary battery 10 will be described below in detail with reference to FIG. 3 to FIG. 6 appropriately.

FIG. 3 to FIG. 6 are graphs illustrating the relationship between the battery capacity and the charging current, the ratio $dQ_{Si}/dQ$ of the amount of change in capacity $Q_{Si}$ of the Si-containing compound to the amount of change in battery capacity Q, and the open-circuit voltage OCV of the battery. Herein, Q denotes battery capacity ($Q_{Si}$+capacity $Q_{BE}$ resulting from a carbon material), and $Q_{Si}$ denotes a capacity resulting from the Si-containing compound. In general, regarding the nonaqueous electrolyte secondary battery 10, the negative electrode 12 serves as a capacity-regulating electrode, and the negative electrode capacity is the battery capacity. The present charging method is particularly suitable for the case in which $I_{3rd}$ described later is 0.5 C or more or 0.7 C or more. In this regard, the rated capacity Qp of the nonaqueous electrolyte secondary battery 10 is, for example, 3,000 mAh to 6,000 mAh.

The method for charging the nonaqueous electrolyte secondary battery 10 includes the following steps.

(1) A first charging step of charging a first capacity $Q_{1st}$ including a capacity range in which $dQ_{Si}/dQ$ is more than or equal to a predetermined threshold value at a first constant current value $I_{1st}$.

(2) A second charging step of charging a second capacity $Q_{2nd}$ at a second constant current value more than the first constant current value after the first charging step is complete.

(3) A detection step of acquiring at least one of a ratio dV/dQ of the amount of change in open-circuit voltage OCV to the battery capacity Q and $dQ_{Si}/Q$.

(4) A changing step of changing at least one of the timing of switching between the first charging step and the second charging step and the first constant current value $I_{1st}$ on the basis of a change in time of dV/dQ or $dQ_{Si}/dQ$.

In the present embodiment, a third charging step of charging a third capacity $Q_{3rd}$ at a third constant current value $I_{3rd}$ more than the second constant current value $I_{2nd}$ is included after the second charging step is complete. The third constant current value $I_{3rd}$ is the maximum charging current ($I_{max}$) in all charging steps. In this case, the changing step changes at least one of the timing of switching between the second charging step and the third charging step and the second constant current value $I_{2nd}$ on the basis of a change in time of dV/dQ or $dQ_{Si}/dQ$. In the present embodiment, three steps of constant-current charging steps are described as an example. However, the constant-current charging steps may be two steps or at least four steps.

Figure 3:
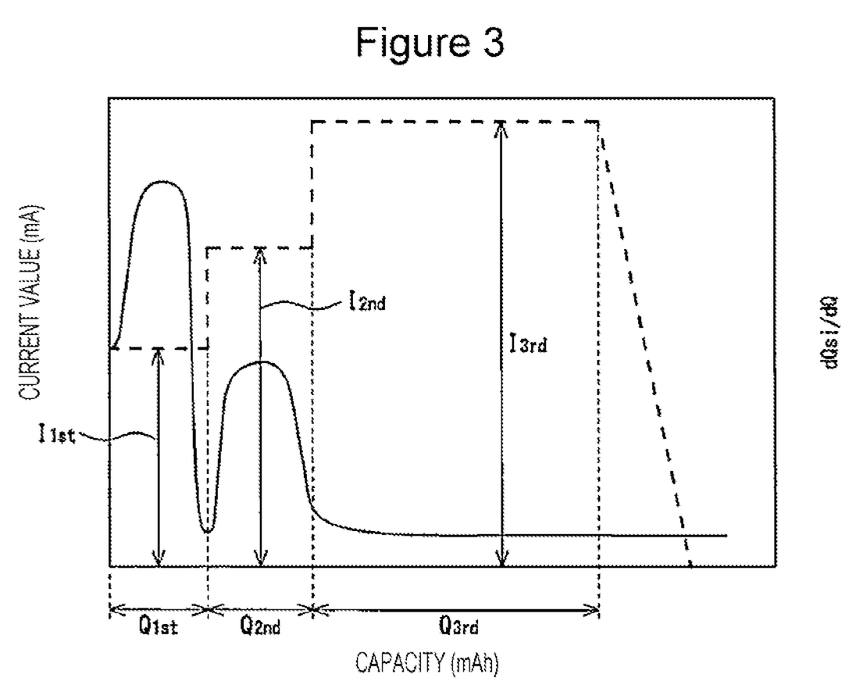
FIG. 3 is a diagram illustrating a method for charging a nonaqueous electrolyte secondary battery that is an example of an embodiment.

The first charging step is performed with respect to the first capacity $Q_{1st}$ including a capacity range in which $dQ_{Si}/dQ$ is more than or equal to a predetermined threshold value. Likewise, the second charging step is performed with respect to the second capacity $Q_{2nd}$ including a capacity range in which $dQ_{Si}/dQ$ is more than or equal to a predetermined threshold value. FIG. 3 illustrates two $dQ_{Si}/dQ$ peaks. The range of the first capacity $Q_{1st}$ corresponds to the first peak width, and the range of the second capacity $Q_{2nd}$ corresponds to the second peak width. The above-described threshold value is set to be within the range of, for example, 0.1 to 0.5, 0.1 to 0.4, or 0.1 to 0.3 and may differ in accordance with the capacity range corresponding to each peak of $dQ_{Si}/dQ$.

As illustrated in FIG. 3, in the charging region of the first capacity $Q_{1st}$, since $dQ_{Si}/dQ$ that is the amount of change in capacity $Q_{Si}$ resulting from the Si-containing compound relative to the amount of change in battery capacity Q is large, lithium ions tend to be occluded by the Si-containing compound rather than by graphite. Performing the constant-current charging in the above-described region while controlling a charging current to be low enables cracking of the Si-containing compound to be suppressed from occurring and enables favorable cycle characteristics to be maintained. Meanwhile, in the charging region of the second capacity $Q_{2nd}$, since $dQ_{Si}/dQ$ is more than that in the charging region of the third capacity $Q_{3rd}$ and since $dQ_{Si}/Q$ is less than that in the charging region of the first capacity $Q_{1st}$, it is preferable that the charging currents be set to satisfy $I_{1st}<I_{2nd}<I_{3rd}$ so as to suppress the Si-containing compound from deteriorating and to increase the charging efficiency.

Preferably, an initial first capacity $Q_{1st}$ is set to be a value that satisfies Formula 1 below, where the ratio of the capacity of the Si-containing compound to the rated capacity Qp is assumed to be x ($0.1 \leq x \leq 0.5$). The capacity ratio x of the Si-containing compound is determined from dV/dQ. Formula 1 is an empirical formula determined from $dQ_{Si}/dQ$ on the basis of each OCV obtained by changing the Si capacity ratio x relative to the rated capacity Qp. In this regard, it is preferable that the first capacity $Q_{1st}$ be changed with time by the changing step.

$$0.38x-0.063-\alpha1 \leq Q_{1st}/Qp \leq 0.38x+0.163+\alpha1 \quad \text{Formula 1:}$$

Herein, α1 is preferably 0.1 and more preferably 0.05.

Preferably, an initial second capacity $Q_{2nd}$ is set to be a value that satisfies Formula 2 below. Formula 2 is an empirical formula similar to Formula 1. In this regard, it is preferable that the second capacity $Q_{2nd}$ be changed with time by the changing step.

$$0.13x+0.173-\alpha2 \leq Q_{2nd}/Qp \leq 0.13x+0.173+\alpha2 \quad \text{Formula 2:}$$

Herein, α2 is preferably 0.1 and more preferably 0.05.

Preferably, an initial first constant current value $I_{1st}$ is set to be a value that satisfies Formula 3 below, where the ratio of the capacity of the Si-containing compound to the rated capacity Qp is assumed to be x (0.1≤x≤0.5). Formula 3 is an empirical formula similar to Formulae 1 and 2. In this regard, it is preferable that the first constant current value $I_{1st}$ be changed with time by the changing step, $$82/(81.8x+64)\times(0.3/0.7)-\alpha3 \leq I_{1st}/I_{max} \leq 82/(81.8x+64)\times(0.3/0.7)+\alpha3 \quad \text{Formula 3:}$$

Herein, α3 is preferably 0.3 and more preferably 0.2.

Preferably, an initial second constant current value $I_{2nd}$ is set to be a value that satisfies Formula 4 below. Formula 4 is an empirical formula similar to Formulae 1 to 3. In this regard, it is preferable that the second constant current value $I_{2nd}$ be changed with time by the changing step.

$$36/(122.4x+10.9)\times(0.5/0.7)-\alpha4 \leq I_{2nd}/I_{max} \leq 36/(122.4x+10.9)\times(0.5/0.7)+\alpha4 \quad \text{Formula 4:}$$

Herein, α4 is preferably 0.3 and more preferably 0.2.

In the present charging method, as described above, the third charging step, in which charging is performed at a third constant current value $I_{3rd}$ (maximum current $I_{max}$ in the present embodiment) when the battery capacity has reached $Q_{2nd}$ is performed. In a charging region in which a change in $Q_{Si}$ is small so that $dQ_{Si}/dQ$ is less than the above-described threshold value, the charging time can be reduced by increasing the charging current so as to perform charging at $I_{3rd}$. The constant-current charging is complete when the battery voltage has reached a predetermined threshold value (for example, 4.2 V). Thereafter, CV charging (constant-voltage charging step) is performed at a predetermined battery voltage (for example, 4.2 V) until the current reaches a predetermined threshold value.

Figure 4:
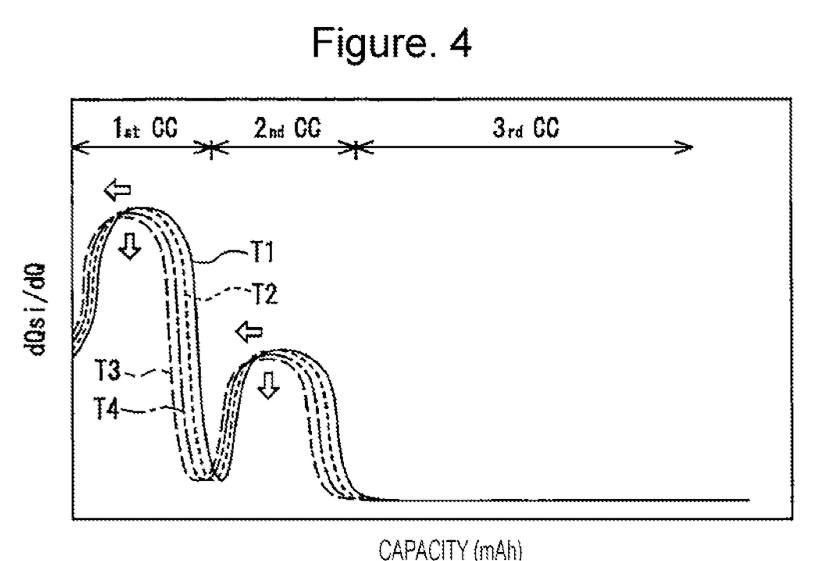
FIG. 4 is a diagram illustrating a method for charging a nonaqueous electrolyte secondary battery that is an example of an embodiment.

FIG. 4 illustrates $dQ_{Si}/dQ$ curves (T2 to T4) when the charge-discharge cycle was repeated. Regarding the number of charge-discharge cycles, T1 (initial)<T2<T3<T4 applies. As illustrated in FIG. 4, the $dQ_{Si}/dQ$ curve changes with increased number of charge-discharge cycles. Specifically, the peak of the $dQ_{Si}/dQ$ curve shifts to the lower-capacity side. In addition, the height of the peak of the $dQ_{Si}/dQ$ curve is reduced. It is conjectured that the changes are caused by a difference between the carbon material and the Si-containing compound in the rate of deterioration of the material due to charging and discharging.

As described above, the method for charging the nonaqueous electrolyte secondary battery 10 includes the detection step and the changing step. Since $dQ_{Si}/dQ$ changes in accordance with the charge-discharge cycle, the first capacity $Q_{1st}$, first constant current value $I_{1st}$, the second capacity $Q_{2nd}$, and the second constant current value $I_{2nd}$ that are set at the initial stage of the charge-discharge cycle may exceed the favorable condition with an increased number of the charge-discharge cycles. Therefore, a change in $dQ_{Si}/dQ$ is detected at each of a predetermined number of charge-discharge cycles, and the timing of switching between the first charging step, the second charging step, and the third charging step is changed in accordance with the change in $dQ_{Si}/dQ$. That is, it is preferable that the first capacity $Q_{1st}$ and the second capacity $Q_{2nd}$ be changed. In addition, it is preferable that the first constant current value $I_{1st}$ and the second constant current value $I_{2nd}$ be changed. Consequently, even when the number of charge-discharge cycles is increased, the favorable charging condition can be maintained, and the cycle characteristics can be further suppressed from deteriorating.

In the detection step, the open-circuit voltage OCV is measured during charging or discharging of the battery so as to acquire dV/dQ. Since $\Delta Q_{Si}$ and $\Delta Q_{Gr}$ when OCV is changed by ΔV are known, $dQ_{Si}/dQ$ can be calculated from dV/dQ. Specifically, $\Delta Q_{Si}$ and $\Delta Q_{Gr}$ in accordance with ΔV ($dQ_{Si}/dV$ and $dQ_{Gr}/dV$) are held in a table, an acquired dV/dQ is used, and a calculation is performed on the basis of $(dQ_{Si}/dV)/(dV/dQ)=dQ_{Si}/dQ$.

Figure 5:
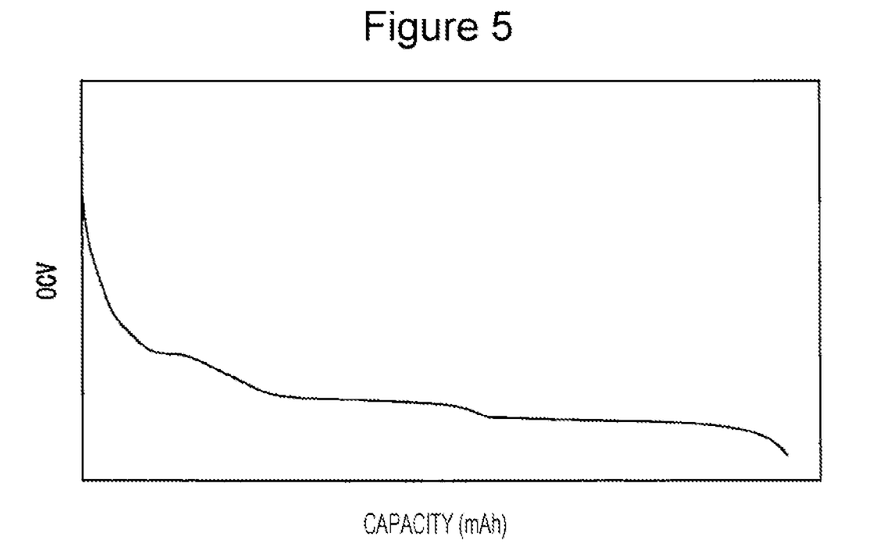
FIG. 5 is a diagram illustrating a method for charging a nonaqueous electrolyte secondary battery that is an example of an embodiment.

FIG. 5 is a charging curve illustrating the relationship between OCV and the capacity of the battery. The charging curve illustrated in FIG. 5 has a plurality of inflection points. The inflection point of the charging curve indicates a change in the charging state of the negative electrode, in particular, a change in the charging state of the Si-containing compound. In this regard, peaks corresponding to the inflection points appear on the dV/dQ curve obtained from the charging curve. Meanwhile, peaks similar to the peaks of the dV/dQ curve appear on the $dQ_{Si}/dQ$ curve obtained on the basis of analysis of dV/dQ. Consequently, the changing step can be performed by using dV/dQ instead of $dQ_{Si}/Q$. In this regard, inflection points that indicate changes in the charging state of the Si-containing compound also appear on the discharging curve of the battery.

The detection step is performed in each predetermined charge-discharge cycle. The detection step is performed at the time when the charging condition should be changed, but there is no particular limitation regarding the timing of performance. For example, the charging control apparatus 2 stores the number of charge-discharge cycles of the battery in the memory portion 9 and performs the detection step when the number of charge-discharge cycles is more than a predetermined number determined in advance. In this regard, the predetermined number of cycles at which the detection step is performed is not limited to being fixed, and the detection step may be performed at a predetermined interval, for example, 3 months, 2 years, or the like.

The detection step may be automatically performed or manually performed. However, when OCV is measured, it is preferable that charging or discharging be performed at a rate lower than the rate in the common usage state. Performance of charging and discharging at a low rate facilitates detection of inflection points of the charge-discharge curve. That is, a change in the charging state of the Si-containing compound may be readily grasped. Therefore, a user may be notified by an alarm display or the like of the time when the charging condition should be changed, and the detection step may be performed on the user approving execution.

Figure 6:
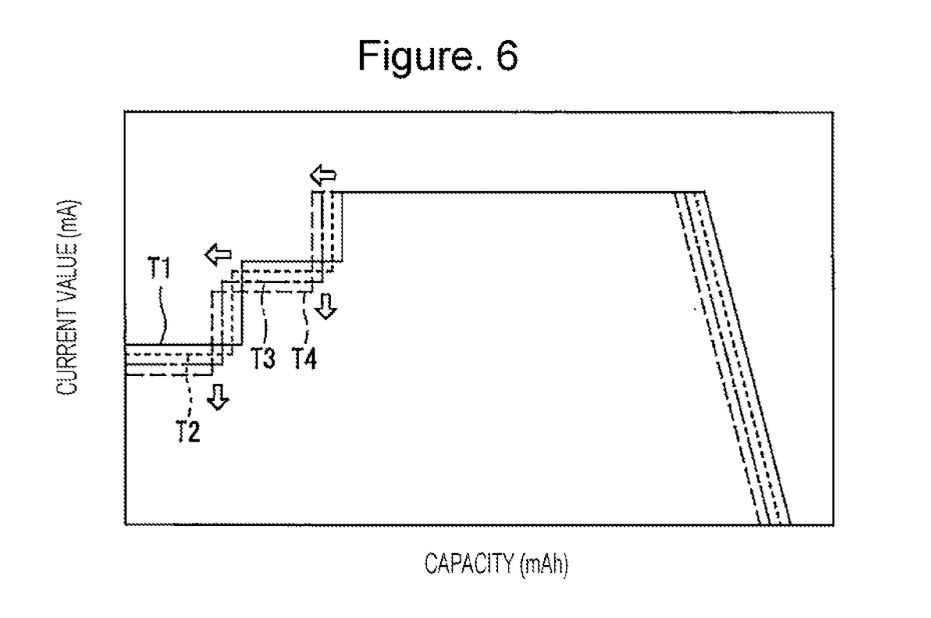
FIG. 6 is a diagram illustrating a method for charging a nonaqueous electrolyte secondary battery that is an example of an embodiment.

As illustrated in FIG. 6, preferably, the changing step changes the timing of switching between the respective charging steps, the first constant current value $I_{1st}$, and the second constant current value $I_{2nd}$ on the basis of the change in dV/dQ or $dQ_{Si}/dQ$ acquired in the detection step. The timing of switching between the respective charging steps only or the charging current only may be changed. However, as illustrated in FIG. 4, since the peak position of the $dQ_{Si}/dQ$ curve shifts to the lower-capacity side and the height of the peak is reduced, it is preferable that both be changed.

The changing step reduces the first capacity $Q_{1st}$ that undergoes the first charging step and reduces the time of the first charging step in accordance with the amount of shift of the peak position of the dV/dQ curve or the $dQ_{Si}/dQ$ curve or with the amount of change in the peak height. That is, the timing of switching between the first charging step and the second charging step is hastened. For example, when the distance between two peaks is reduced by 10% from the initial state, the first capacity $Q_{1st}$ may be reduced by 10%.

Further, the changing step reduces the first constant current value $I_{1st}$ in accordance with the amount of shift of the peak position of the dV/dQ curve or the $dQ_{Si}/dQ$ curve or with the amount of change in the peak height. The second capacity $Q_{2nd}$ and the second constant current value $I_{2nd}$ can also be changed in accordance with the amount of shift of the peak position of the dV/dQ curve or the $dQ_{Si}/dQ$ curve or with the amount of change in the peak height.

Figure 7:
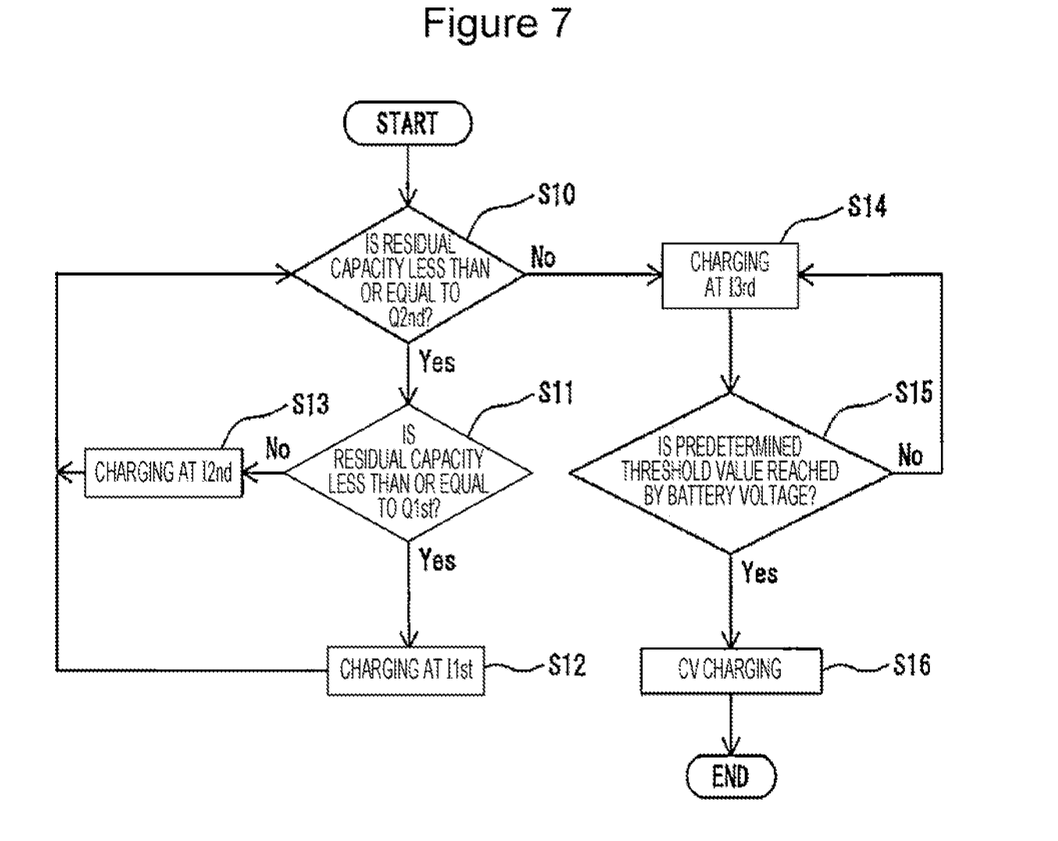
FIG. 7 is a flow chart illustrating an example of a charging control procedure for a nonaqueous electrolyte secondary battery.

FIG. 7 is a flow chart illustrating an example of a control procedure in the above-described charging method. Herein, a specific example of charging control will be described with reference to the case in which the residual capacity of the nonaqueous electrolyte secondary battery 10 is lower than the starting level of CV charging.

As illustrated in FIG. 7, when a battery is charged, initially, the residual capacity of the battery is checked (S10, S11). For example, the charging control apparatus 2 estimates the SOC (residual capacity) of the battery on the basis of detection information such as the battery voltage and the like acquired by the battery monitoring unit 30. In the case in which the residual capacity of the battery is less than or equal to the first capacity $Q_{1st}$, the first charging step of performing charging at the first constant current value $I_{1st}$ until the battery capacity reaches $Q_{1st}$ is performed (S12). The first capacity $Q_{1st}$ is within a capacity range in which $dQ_{Si}/dQ$ is more than or equal to a predetermined threshold value (for example, 0.1) and is set on the basis of Formula 1 above. In this regard, the first constant current value $I_{1st}$ is set on the basis of Formula 3 above. The first charging step is performed by the function of the first charging control device 3.

Meanwhile, in the case in which the residual capacity of the battery is more than or equal to the first capacity $Q_{1st}$ and less than or equal to the second capacity $Q_{2nd}$, the second charging step of performing charging at the second constant current value $I_{2nd}$ until the battery capacity reaches $Q_{2nd}$ is performed (S13). The second capacity $Q_{2nd}$ S within a capacity range in which $dQ_{Si}/dQ$ is more than or equal to a predetermined threshold value (for example, 0.1) and is set on the basis of Formula 2 above. In this regard, the second constant current value $I_{2nd}$ is set on the basis of Formula 4 above. The second charging step is performed by the function of the second charging control device 4. Subsequently, provided that the residual capacity of the battery has reached $Q_{2nd}$ the third charging step of performing charging at the third constant current value $I_{3rd}$ ($I_{max}$) until the battery capacity reaches a predetermined threshold value is performed (S14, S15). The third charging step is performed by the function of the third charging control device 5.

That is, in the present embodiment, three steps of CC charging is performed until the battery voltage reaches a predetermined threshold value. When the battery voltage reaches the predetermined threshold value, a constant-voltage charging step of performing CV charging until the current reaches a predetermined threshold value (S16). The constant-voltage charging step is performed by the function of the constant-voltage charging control device 6.

Figure 8:
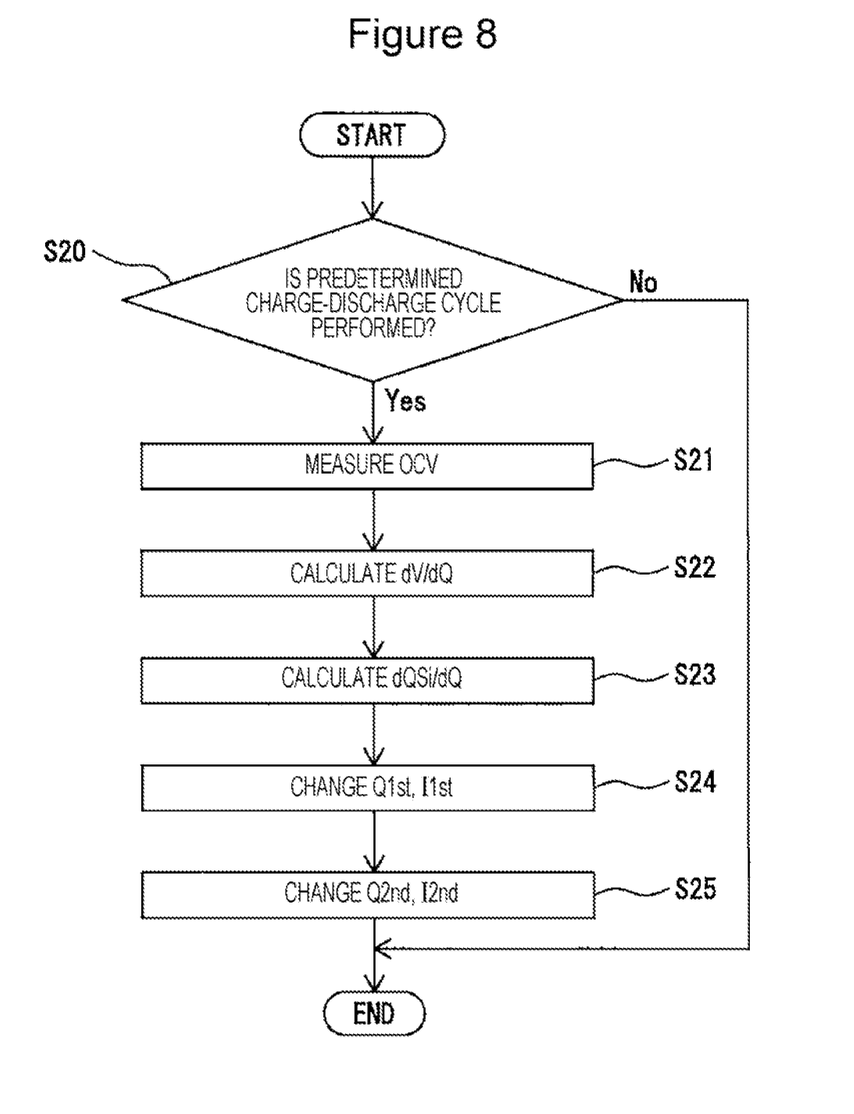
FIG. 8 is a flow chart illustrating an example of a charging control procedure for a nonaqueous electrolyte secondary battery.

FIG. 8 is a flow chart illustrating an example of a control procedure in the above-described charging method and illustrates the procedure of changing the timing of switching between the respective charging control steps and the procedure of changing the driving current.

As illustrated in FIG. 8, when predetermined charge-discharge cycles are performed (S20), OCV of the battery is measured (S21), and dV/dQ is calculated (S22). Further, in the example illustrated in FIG. 8, $dQ_{Si}/Q$ is calculated on the basis of analysis of dV/dQ (S23). Since similar peaks appear on the dV/dQ curve and the $dQ_{Si}/dQ$ curve that indicate changes in the charging state of the Si-containing compound, the changing step may be performed on the basis of dV/dQ. The detection steps of S20 to S23 are performed by the function of the detection device 7.

Next, the first capacity $Q_{1st}$, the first constant current value $I_{1st}$, the second capacity $Q_{2nd}$, and the second constant current value $I_{2nd}$ are changed on the basis of $dQ_{Si}/dQ$ acquired in the detection step (S24, S25). That is, the timing of switching between the respective charging steps and the charging currents in the first charging step and the second charging step are changed. As described above, since the peak position of the $dQ_{Si}/dQ$ curve shift to the lower-capacity side and the height of the peak is reduced with increased number of charge-discharge cycles, each of the first capacity $Q_{1st}$, the first constant current value $I_{1st}$, the second capacity $Q_{2nd}$ and the second constant current value $I_{2nd}$ is reduced. The changing steps of S24 and S25 are performed by the function of the changing device 8.

According to the above-described charging method, efficient charging can be performed while favorable cycle characteristics are maintained.

REFERENCE SIGNS LIST 1 charging system
2 charging control apparatus
3 first charging control device
4 second charging control device
5 third charging control device
6 constant-voltage charging control device
7 detection device
8 changing device
9 memory portion
10 nonaqueous electrolyte secondary battery
11 positive electrode
12 negative electrode
13 separator
14 electrode body
15 battery case
16 outer jacket can
17 sealing body
18, 19 insulating plate
20 positive electrode tab
21 negative electrode tab
22 grooved portion
23 filter
24 lower valve body
25 insulating member
26 upper valve body
27 cap
28 gasket 30 battery monitoring unit
100 power supply
101 load

The invention claimed is:

1. A method for charging a nonaqueous electrolyte secondary battery including a negative electrode that contains a carbon material and a Si-containing compound as a negative electrode active material, the method comprising the steps of charging a first capacity $Q_{1st}$ at a first constant current value $I_{1st}$, the first capacity $Q_{1st}$ including a capacity range in which the ratio $dQ_{Si}/dQ$ of the amount of change in capacity $Q_{Si}$ of the Si-containing compound relative to the amount of change in battery capacity Q is more than or equal to a predetermined threshold value, as a first charging step;

charging a second capacity at a. second constant current value more than the first constant current value in a second charging step after the first charging step is complete;

acquiring at least one of the ratio dV/dQ of the amount of change in open-circuit voltage relative to the amount of change in battery capacity Q and $dQ_{Si}/dQ$, as a detection step; and changing at least one of the timing of switching between the first charging step and the second charging step and the first constant current value $I_{1st}$ on the basis of a change in time of dV/dQ or $dQ_{Si}/dQ$, as a changing step.

2. The method for charging a nonaqueous electrolyte secondary battery according to claim 1, wherein in the detection step, dV/dQ is acquired by measuring the open-circuit voltage during charging or discharging of the battery.

3. The method for charging a nonaqueous electrolyte secondary battery according to claim 1, wherein in the changing step, the timing of switching between the first charging step and the second charging step and the first constant current value $I_{1st}$ is changed on the basis of a change in time of dV/dQ or $dQ_{Si}/dQ$.

4. The method for charging a nonaqueous electrolyte secondary battery according to claim 1, comprising the step of charging a third capacity at a third constant current value more than the second constant current value in a third charging step after the second charging step, wherein the changing step changes at least one of the timing of switching between the second charging step and the third charging step and the second constant current value on the basis of a change in time of dV/AQ or $dQ_{Si}/dQ$.

5. The method for charging a. nonaqueous electrolyte secondary battery according to claim 1, wherein an initial first capacity $Q_{1st}$ is set to be a value satisfying the following formula, where the ratio of the capacity $Q_{Si}$ of the Si-containing compound to the rated capacity Qp is denoted as x (0.1≤x≤0.5), $$0.38x-0.063-\alpha 1 \leq Q_{1st}/Q \leq 0.38x+0.163+\alpha 1.$$ Formula:

6. The method for charging a nonaqueous electrolyte secondary battery according to any one of claim 1, wherein the initial first constant current value $I_{1st}$ is set to be a value satisfying the following formula, where the ratio of the capacity $Q_{Si}$ of the Si-containing compound to the rated capacity Qp is denoted as x (0.1≤x≤0.5)

$$82/(81.8x+64)\times(0.3/0.7)-\alpha 3 \leq I_{1st}/I_{max} \leq 82/(81.8x+64)\times(0.3/0.7)+\alpha 3.$$ Formula:

7. A charging system for charging a nonaqueous electrolyte secondary battery including a negative electrode that contains a carbon material and a Si-containing compound as a negative electrode active material, comprising a charging control apparatus that performs the method for charging according to claim 1.

* * * * *